(12) United States Patent
Sobolewski et al.

(10) Patent No.: US 10,656,181 B2
(45) Date of Patent: May 19, 2020

(54) REJECTION OF MECHANICAL VIBRATION INDUCED NOISE IN ELECTRICAL MEASUREMENTS

(71) Applicant: KEITHLEY INSTRUMENTS, LLC, Solon, OH (US)

(72) Inventors: Gregory Sobolewski, Brecksville, OH (US); Michael D. Rayman, Akron, OH (US); Nathan A. Schatt, Cleveland, OH (US)

(73) Assignee: Keithley Instruments, LLC, Solon, OH (US)

( * ) Notice: Subject to any disclaimer, the term of this patent is extended or adjusted under 35 U.S.C. 154(b) by 441 days.

(21) Appl. No.: 15/476,679

(22) Filed: Mar. 31, 2017

(65) Prior Publication Data

US 2017/0285070 A1 Oct. 5, 2017

Related U.S. Application Data

(60) Provisional application No. 62/318,680, filed on Apr. 5, 2016.

(51) Int. Cl.
*G01R 1/44* (2006.01)
*G01R 1/30* (2006.01)
*G01R 15/12* (2006.01)

(52) U.S. Cl.
CPC .............. *G01R 1/44* (2013.01); *G01R 1/30* (2013.01); *G01R 15/125* (2013.01)

(58) Field of Classification Search
CPC ................. G01R 1/0458; G01R 31/2884
See application file for complete search history.

(56) References Cited

U.S. PATENT DOCUMENTS

| | | | |
|---|---|---|---|
| 2007/0002329 A1 | 1/2007 | Kasapi et al. | |
| 2008/0162087 A1 | 7/2008 | Szasz et al. | |
| 2010/0164421 A1* | 7/2010 | Dishman | F04D 27/004 318/478 |
| 2013/0076286 A1* | 3/2013 | Patton | F16F 15/00 318/460 |
| 2015/0054492 A1* | 2/2015 | Mende | G01R 15/125 324/115 |

FOREIGN PATENT DOCUMENTS

WO 2015/052294 4/2015

OTHER PUBLICATIONS

European Patent Office, Extended European Search Report and Written Opinion for European Application 17165119.3, dated Dec. 4, 2017, 5 pages, European Patent Office, Munich, Germany.

* cited by examiner

*Primary Examiner* — Tung X Nguyen
(74) *Attorney, Agent, or Firm* — Miller Nash Graham & Dunn; Andrew J. Harrington

(57) ABSTRACT

An electronic test measurement system can include a device under test (DUT) and an electronic test instrument that includes a signal input configured to receive an electrical signal from the DUT, a cooling mechanism, and a processor. The processor can be configured to determine a frequency at which the cooling mechanism should operate, cause the cooling mechanism to operate at the determined frequency, select a filter based on the determined frequency, and apply the filter to the electrical signal to reduce interference with the electrical signal resulting from mechanical vibrations of the cooling mechanism.

20 Claims, 2 Drawing Sheets

REJECTION OF MECHANICAL VIBRATION INDUCED NOISE IN ELECTRICAL MEASUREMENTS

CROSS-REFERENCE TO RELATED APPLICATION

This application claims the benefit of U.S. Provisional Application Ser. No. 62/318,680, titled "REJECTION OF MECHANICAL VIBRATION INDUCED NOISE IN ELECTRICAL MEASUREMENTS" and filed on Apr. 5, 2016, the content of which is hereby fully incorporated by reference herein.

TECHNICAL FIELD

Embodiments of the disclosed technology generally relate to electrical test instrumentation and, in particular, to digital multi-meters (DMMs), power supplies, and source measure units (SMUs).

BACKGROUND

Electronic test equipment, such as oscilloscopes, digital multi-meters (DMMs), and source measure units (SMUs) for example, typically include a cooling mechanism to dissipate heat generated by the power supplies, measurement circuitry, processors, and other internal components of the test equipment. Generally, it is desirable to operate the cooling mechanism so as to maintain a constant internal temperature in the electronic test equipment in order to minimize thermal effects on measurements made by the equipment. Such cooling mechanisms often include a chassis-mounted cooling fan. However, such cooling fans produce mechanical vibrations in the test equipment which are known to adversely impact many kinds of electronic measurements taken by the test equipment, particularly sensitive measurements. Prior attempts to suppress these mechanical vibrations have been passive by nature such as rubber mounting posts or grommets attached between the electronic test equipment chassis and the cooling fan, for example. But such attempts have been consistently unsuccessful in minimizing the adverse impact resulting from the mechanical vibrations.

Thus, there remains a need for a solution to the problems created by such mechanical vibrations in electronic test equipment.

DETAILED DESCRIPTION

Implementations of the disclosed technology generally include systems and methods for actively controlling mechanical vibrations resulting from certain components such as chassis-mounted cooling fans within different kinds of electronic test equipment such as digital multi-meters (DMMs), source measure units (SMUs), and various types of oscilloscopes. Such implementations may include controlling the speed of the cooling fans within the electronic test equipment to specific known frequencies that can then be suppressed within signals measured by the electronic test equipment using virtually any suitable digital signal processing (DSP) techniques, for example.

Figure 1:
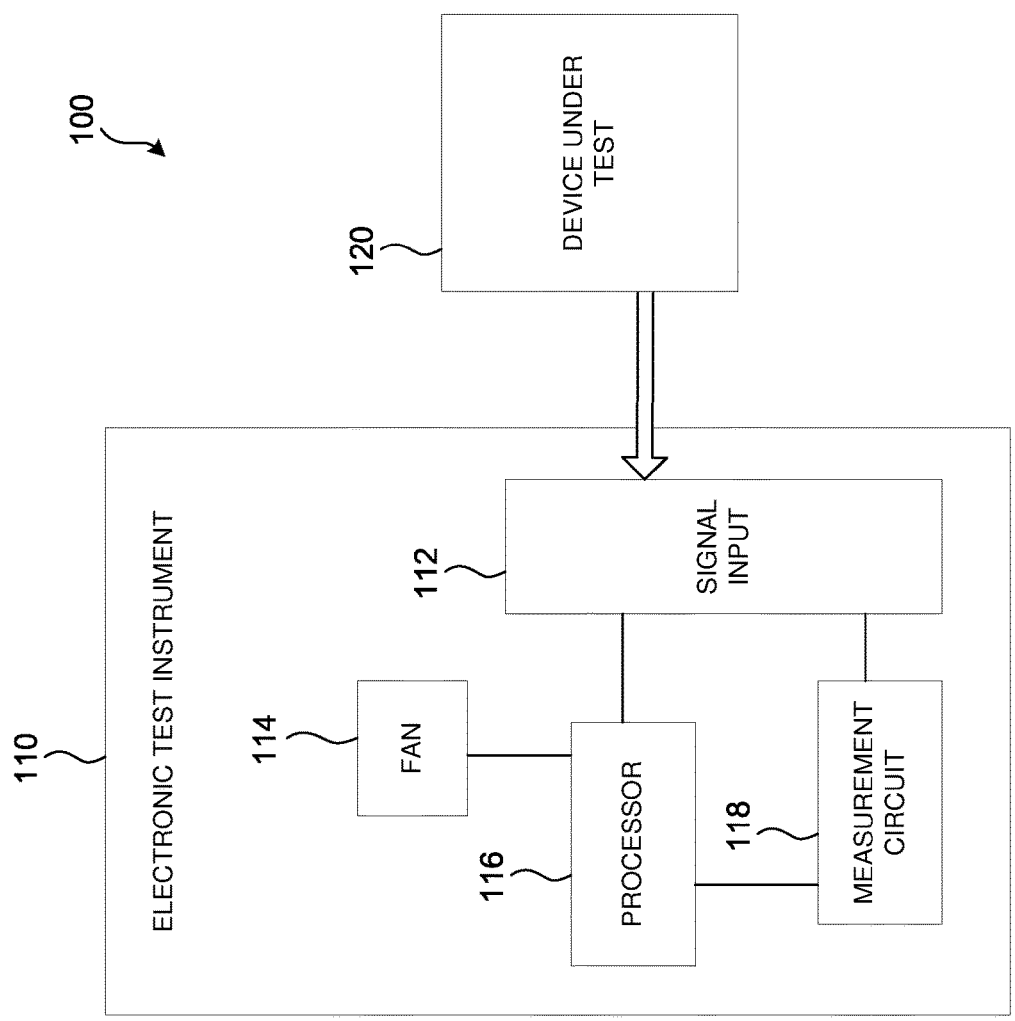
FIG. 1 is a block diagram illustrating an example of an electronic test measurement system in accordance with certain implementations of the disclosed technology.

FIG. 1 is a block diagram illustrating an example of an electronic test and measurement system 100 in accordance with certain implementations of the disclosed technology. In the example, the system 100 includes an electronic test instrument 110, such as a DMM, SMU, or oscilloscope, that includes at least one signal input 112 configured to receive an electronic signal from a device under test (DUT) 120.

In the example, the electronic test instrument 110 also includes a cooling mechanism 114, such as one or more chassis-mounted fans, for cooling the test instrument 110, for example. The cooling mechanism 114 may be virtually any suitable device, component, or mechanism for cooling the test instrument 110 as a whole, or performing some other function, for example, cooling a specific component of the test instrument 110, such as a processor or a particular integrated circuit (IC).

In the example, the electronic test instrument 110 also includes a processor 116 that can be configured to receive and process the signal received from the signal input 112. Alternatively or in addition thereto, the processor 116 may also be configured to control operation of the fan 114.

In some embodiments, the electronic test instrument 110 also includes a measurement circuit 118. The measurement circuit 118 is coupled to the signal input 112 and is configured to perform a measurement on the signal received from the signal input 112. The measurement circuit 118 may include, for example, amplifiers, attenuators, mixers, bias circuits, sample-and-hold circuits, analog-to-digital converters, memory, trigger circuitry, or other sub-circuits.

In some embodiments, the measurement circuit 118 is configured to perform a sensitive measurement on the received signal. It should be noted that, as used herein, the term "sensitive measurement" generally refers to and includes current, voltage, and/or other types of measurements that are sensitive to—and can be detrimentally impacted by—mechanical vibrations such as would result from ordinary operation of the fan 114. For example, low-current measurements often made with SMUs are one type of sensitive measurement.

Absent implementation of the disclosed techniques, the transduction of random, or varying, and/or unknown frequency mechanical vibrations of the fan 114 to variations of current flow in the test instrument 110 during the process of performing sensitive measurements on the signal received by the signal input 112, e.g. by the measurement circuit 118, disadvantageously induces too much noise into the measurements and, thus, undesirably and significantly affect both the accuracy and repeatability of the measurements taken by the test instrument 110.

Certain implementations of the disclosed technology include actively controlling the speed of the fan 114, e.g., by the processor 116, to specific and known frequencies such that the mechanical vibrations of the fan 114 that are induced into the test measurement instrument 110 can then be suppressed by way of virtually any suitable digital signal processing (DSP) techniques. Such DSP techniques may be employed during or after the analog-to-digital converter (ADC) measurement window, for example.

Figure 2:
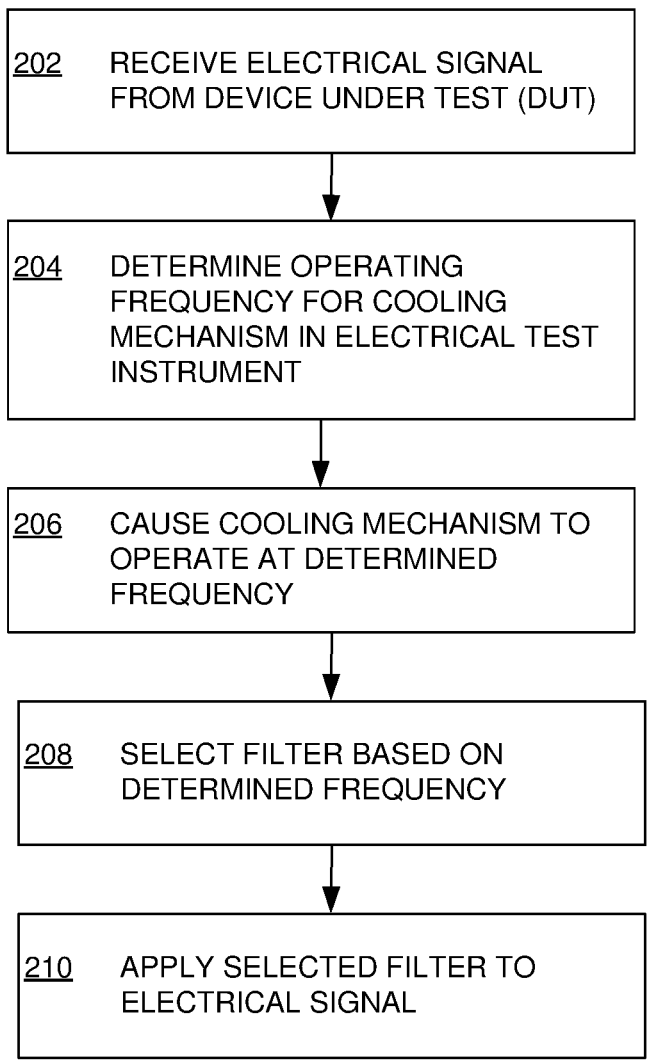
FIG. 2 is a flow diagram illustrating an example of a processor-controlled method for an electronic test measurement system in accordance with certain implementations of the disclosed technology.

FIG. 2 is a flow diagram illustrating an example of a processor-controlled method 200 for an electronic test measurement system, such as the test measurement system 100 illustrated by FIG. 1, in accordance with certain implementations of the disclosed technology.

At 202, an electrical signal is received, e.g., by the signal input 112 of the test instrument 110 from the DUT 120. The test instrument may perform a sensitive measurement, such as a voltage measurement or a current measurement, for example, on the electrical signal received by the signal input 112.

At 204, a frequency is determined, e.g., by the processor 116, at which the cooling mechanism of the electrical test instrument 110 should operate. At 206 the cooling mechanism is caused, e.g., by the processor 116, to operate at the determined frequency.

At 208, a filter is selected, e.g., by the processor 116, based at least in part on the determined frequency. At 210, the filter to the electrical signal to reduce interference with the electrical signal resulting from mechanical vibrations of the cooling mechanism. The filter thus advantageously reduces or eliminates interfering noise that generally results from the mechanical vibrations of the cooling mechanism.

Certain implementations of the disclosed technology include a closed-loop control system configured to take as an input a tachometer output of the fan and then drive as an output a pulse width modulated (PWM) signal driving the input to the fan in order to control the fan speed based on the duty-cycle percentage of the PWM signal. That is, rather than allowing the closed-loop control system to vary the fan speed in the continuous spectrum, e.g., from zero revolutions per minute (RPM) to the fan's maximum speed, the controller may be directed to control fan speeds to specific speed values.

In order to minimize or even eliminate random and/or unknown mechanical frequency noise induced into low-level measurement conductors or cables, the fan speed may be controlled tightly to any integer multiple of 300 RPM, for example. Because 300 RPM—and any integer multiple of it—is a harmonic of both 50 Hz and 60 Hz, such sets of allowed speeds may advantageously work regardless of the power line frequency supplied to the electronic test instrument, e.g., the instrument's main power supply. That is, in certain embodiments, selected fan speeds may be mathematical integer multiples of 50 Hz and/or 60 Hz.

Once the fan is controlled to one of these speeds, virtually any suitable technique employed by the test instrument to reduce or eliminate 50 Hz and/or 60 Hz power line cycle noise may advantageously be effective in reducing or even eliminating the noise that is induced by the mechanical vibrations that result from the fan's rotations.

In alternative embodiments, the fan control system may be more flexible by detecting software configuration settings that indicate within which power region the product is being used, e.g., 50 Hz or 60 Hz, and then, with that knowledge of the power region, the fan control system can use different fan speeds that are integer multiples of either 50 Hz or 60 Hz while not being required to use fan speeds that work for both regions.

Certain implementations may include fast acquisitions using ADCs while sweeping fan speed in order to analyze the spectrum of mechanical vibrations prior to any electrical measurements. This can be used to determine an offline characterization of the mechanical system, the results of which can be applied quickly during electrical measurements without requiring time-expensive mechanical analysis during the measurement.

The speed of one or more fans can be controlled to a specifically chosen frequency such that the measured noise induced by the mechanical vibrations of the fan(s) can be suppressed, e.g., by filtering the pertinent frequency as well as its harmonics.

In certain implementations, measuring mechanical vibrations near or at the electrical measurement circuit and reducing or outright removing their detrimental effects on the electrical measurements may be improved by way of calibration.

EXAMPLES

Illustrative examples of the technologies disclosed herein are provided below. An embodiment of the technologies may include any one or more, and any combination of, the examples described below.

Example 1 is directed to an electronic test instrument comprising: a signal input configured to receive an electrical signal; a cooling mechanism; and a processor configured to: determine a frequency at which the cooling mechanism should operate; cause the cooling mechanism to operate at the determined frequency; select a filter based on the determined frequency; and apply the filter to the electrical signal to reduce interference with the electrical signal resulting from mechanical vibrations of the cooling mechanism.

Example 2 includes the subject matter of claim 1, wherein the cooling mechanism comprises a cooling fan.

Example 3 includes the subject matter of claim 2, wherein the cooling fan is a chassis-mounted cooling fan.

Example 4 includes the subject matter of any of claims 1-3, wherein the determined frequency is a harmonic of 50 Hz, 60 Hz, or both 50 Hz and 60 Hz.

Example 5 includes the subject matter of any of claims 1-4, and further comprising a measurement circuit configured to perform a sensitive measurement on the received electrical signal.

Example 6 includes the subject matter of claim 5, wherein the sensitive measurement includes a voltage measurement, a current measurement, or a combination thereof.

Example 7 is directed to a processor-controlled method comprising: determining a frequency at which a cooling mechanism of an electronic test instrument should operate; causing the cooling mechanism to operate at the determined frequency; selecting a signal filter based on the determined frequency; and applying the signal filter to an electrical signal being measured by the electronic test instrument to reduce effects on the electrical signal resulting from mechanical vibrations of the cooling mechanism.

Example 8 includes the subject matter of claim 7, wherein the cooling mechanism comprises a cooling fan.

Example 9 includes the subject matter of claim 8, the method further comprising detecting software configuration settings that indicate which power region is being used.

Example 10 includes the subject matter of claim 9, the method further comprising causing the cooling fan to run at a frequency that is a harmonic of 50 Hz, 60 Hz, or both 50 Hz and 60 Hz.

Example 11 includes the subject matter of any of claims 7-10, wherein the electronic test instrument performs a sensitive measurement on the electrical signal.

Example 12 includes the subject matter of claim 11, wherein the sensitive measurement includes a voltage measurement, a current measurement, or a combination thereof.

Example 13 is directed to an electronic test measurement system comprising: a device under test (DUT); and an electronic test instrument that includes: a signal input configured to receive an electrical signal from the DUT; a cooling mechanism; and a processor configured to: determine a frequency at which the cooling mechanism should operate; cause the cooling mechanism to operate at the determined frequency; select a filter based on the determined frequency; and apply the filter to the electrical signal to reduce interference with the electrical signal resulting from mechanical vibrations of the cooling mechanism.

Example 14 includes the subject matter of claim 13, wherein the cooling mechanism comprises a chassis-mounted cooling fan.

Example 15 includes the subject matter of any of claims 13-14, wherein the determined frequency is a harmonic of 50 Hz, 60 Hz, or both 50 Hz and 60 Hz.

Example 16 includes the subject matter of any of claims 13-15, and wherein the electronic test instrument further comprises a measurement circuit configured to perform a sensitive measurement on the received electrical signal.

Example 17 includes the subject matter of claim 16, wherein the sensitive measurement includes a voltage measurement, a current measurement, or a combination thereof.

Example 18 includes the subject matter of any of claims 13-17, wherein the electronic test instrument is a digital multi-meter (DMM).

Example 19 includes the subject matter of any of claims 13-17, wherein the electronic test instrument is a source measure unit (SMU).

Example 20 includes the subject matter of any of claims 13-17, wherein the electronic test instrument is an oscilloscope.

Computer-readable media means any media that can be accessed by a computing device. By way of example, and not limitation, computer-readable media may comprise computer storage media and communication media.

Computer storage media means any medium that can be used to store computer-readable information. By way of example, and not limitation, computer storage media may include random access memory (RAM), read-only memory (ROM), electrically erasable programmable read-only memory (EEPROM), flash memory or other memory technology, compact disk read-only memory (CD-ROM), digital video disk (DVD) or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, radio frequency (RF), infrared, acoustic or other types of signals.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated.

In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

The invention claimed is:

1. An electronic test instrument, comprising:
   a signal input configured to receive an electrical signal;
   a cooling mechanism; and
   a processor configured to:
      determine a frequency at which the cooling mechanism should operate;
      cause the cooling mechanism to operate at the determined frequency;
      select a filter based on the determined frequency; and
      apply the filter to the electrical signal to reduce interference with the electrical signal resulting from mechanical vibrations of the cooling mechanism.

2. The electronic test instrument of claim 1, wherein the cooling mechanism comprises a cooling fan.

3. The electronic test instrument of claim 2, wherein the cooling fan is a chassis-mounted cooling fan.

4. The electronic test instrument of claim 1, wherein the determined frequency is a harmonic of 50 Hz, 60 Hz, or both 50 Hz and 60 Hz.

5. The electronic test instrument of claim 1, further comprising a measurement circuit configured to perform a sensitive measurement on the received electrical signal.

6. The electronic test instrument of claim 5, wherein the sensitive measurement includes a voltage measurement, a current measurement, or a combination thereof.

7. A processor-controlled method, comprising:
   determining a frequency at which a cooling mechanism of an electronic test instrument should operate;
   causing the cooling mechanism to operate at the determined frequency;
   selecting a signal filter based on the determined frequency; and
   applying the signal filter to an electrical signal being measured by the electronic test instrument to reduce effects on the electrical signal resulting from mechanical vibrations of the cooling mechanism.

8. The processor-controlled method of claim 7, wherein the cooling mechanism comprises a cooling fan.

9. The processor-controlled method of claim 8, further comprising detecting software configuration settings that indicate which power region is being used.

10. The processor-controlled method of claim 9, further comprising causing the cooling fan to run at a frequency that is a harmonic of 50 Hz, 60 Hz, or both 50 Hz and 60 Hz.

11. The processor-controlled method of claim 7, wherein the electronic test instrument performs a sensitive measurement on the electrical signal.

12. The processor-controlled method of claim 11, wherein the sensitive measurement includes a voltage measurement, a current measurement, or a combination thereof.

13. An electronic test measurement system, comprising:
   a device under test (DUT); and
   an electronic test instrument that includes:
      a signal input configured to receive an electrical signal from the DUT;
      a cooling mechanism; and
      a processor configured to:
         determine a frequency at which the cooling mechanism should operate;

cause the cooling mechanism to operate at the determined frequency;

select a filter based on the determined frequency; and apply the filter to the electrical signal to reduce interference with the electrical signal resulting from mechanical vibrations of the cooling mechanism.

14. The electronic test measurement system of claim 13, wherein the cooling mechanism comprises a chassis-mounted cooling fan.

15. The electronic test measurement system of claim 13, wherein the determined frequency is a harmonic of 50 Hz, 60 Hz, or both 50 Hz and 60 Hz.

16. The electronic test measurement system of claim 13, wherein the electronic test instrument further comprises a measurement circuit configured to perform a sensitive measurement on the received electrical signal.

17. The electronic test measurement system of claim 16, wherein the sensitive measurement includes a voltage measurement, a current measurement, or a combination thereof.

18. The electronic test measurement system of claim 13, wherein the electronic test instrument is a digital multimeter (DMM).

19. The electronic test measurement system of claim 13, wherein the electronic test instrument is a source measure unit (SMU).

20. The electronic test measurement system of claim 13, wherein the electronic test instrument is an oscilloscope.

* * * * *